United States Patent
Han et al.

(10) Patent No.: US 9,515,294 B2
(45) Date of Patent: Dec. 6, 2016

(54) LASER BEAM IRRADIATION APPARATUS AND MANUFACTURING METHOD OF ORGANIC LIGHT EMITTING DISPLAY APPARATUS USING THE SAME

(71) Applicant: SAMSUNG DISPLAY CO., LTD., Yongin, Gyeonggi-Do (KR)

(72) Inventors: Gyoo-Wan Han, Yongin (KR); Ku-Hyun Kang, Yongin (KR); Hae-Sook Lee, Yongin (KR); Jin-Hong Jeun, Yongin (KR); Kyoung-Seok Cho, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/510,322

(22) Filed: Oct. 9, 2014

(65) Prior Publication Data

US 2015/0243934 A1  Aug. 27, 2015

(30) Foreign Application Priority Data

Feb. 27, 2014 (KR) .................. 10-2014-0023712

(51) Int. Cl.
| | |
|---|---|
| *H01L 51/56* | (2006.01) |
| *G02B 26/10* | (2006.01) |
| *G02B 27/10* | (2006.01) |
| *G02B 27/14* | (2006.01) |

(Continued)

(52) U.S. Cl.
CPC .............. *H01L 51/56* (2013.01); *G02B 26/10* (2013.01); *G02B 27/10* (2013.01); *G02B 27/144* (2013.01); *H01L 51/5228* (2013.01); *H01L 27/3244* (2013.01)

(58) Field of Classification Search
CPC ........................................... H01L 51/56
See application file for complete search history.

(56) References Cited

U.S. PATENT DOCUMENTS

| | | | | |
|---|---|---|---|---|
| 4,925,523 A | * | 5/1990 | Braren ................... | A61B 18/20 216/62 |
| 5,099,341 A | * | 3/1992 | Nosaki ................... | H04N 1/401 358/461 |

(Continued)

FOREIGN PATENT DOCUMENTS

| | | |
|---|---|---|
| JP | 2005-11810 A | 1/2005 |
| KR | 2002-0032607 A | 5/2002 |

(Continued)

OTHER PUBLICATIONS

Liu, D. "Ultrafast parallel laser processing of materials for high throughput manufacturing" Proc. LAMP2009 Jan. 2009 pp. 1-5.*

(Continued)

*Primary Examiner* — Asok K Sarkar
*Assistant Examiner* — Grant Withers
(74) *Attorney, Agent, or Firm* — Lee & Morse P.C.

(57) ABSTRACT

A laser beam irradiation apparatus includes a laser light source, a controller for controlling energy of light generated by the laser source, a first optical system for adjusting a shape of light that has passed through the controller, a scanner for adjusting the direction of light that has passed through the first optical system, and an F-theta lens for reducing a beam that has passed through the scanner.

10 Claims, 5 Drawing Sheets

(51) Int. Cl.
*H01L 51/52* (2006.01)
*H01L 27/32* (2006.01)

(56) References Cited

U.S. PATENT DOCUMENTS

| | | | | |
|---|---|---|---|---|
| 5,232,549 A * | 8/1993 | Cathey | G03F 7/0007 | 216/20 |
| 5,600,126 A * | 2/1997 | Appel | H01S 5/4025 | 250/205 |
| 5,659,414 A * | 8/1997 | Appel | G02B 26/127 | 250/205 |
| 6,002,506 A * | 12/1999 | Suzuki | G02B 26/105 | 359/198.1 |
| 6,136,622 A * | 10/2000 | Fukuzawa | H01L 27/3281 | 313/498 |
| 6,506,635 B1 * | 1/2003 | Yamazaki | H01L 21/2026 | 257/E21.134 |
| 6,573,661 B2 * | 6/2003 | Fowlkes | G02F 1/133555 | 313/461 |
| 6,683,277 B1 * | 1/2004 | Millard | B23K 26/123 | 219/121.84 |
| 6,888,096 B1 * | 5/2005 | Hamada | B23K 26/0738 | 219/121.7 |
| 2003/0180983 A1 * | 9/2003 | Oswald | H01L 31/18 | 438/57 |
| 2004/0253756 A1 * | 12/2004 | Cok | H01L 51/5218 | 438/22 |
| 2004/0259387 A1 * | 12/2004 | Yamazaki | B23K 26/0604 | 438/795 |
| 2005/0129977 A1 * | 6/2005 | Poon | H01L 51/0014 | 428/690 |
| 2005/0231105 A1 * | 10/2005 | Lovell | B23K 26/38 | 313/506 |
| 2005/0236975 A1 * | 10/2005 | Addington | H01L 51/0014 | 313/504 |
| 2006/0199476 A1 * | 9/2006 | Cok | B23K 26/1464 | 451/38 |
| 2008/0049285 A1 * | 2/2008 | Pinard | B23K 26/082 | 359/202.1 |
| 2008/0287028 A1 * | 11/2008 | Ozawa | H01L 51/56 | 445/24 |
| 2009/0081512 A1 * | 3/2009 | Blanchard | H01M 8/122 | 429/425 |
| 2009/0116107 A1 * | 5/2009 | Kindler | G02B 26/123 | 359/457 |
| 2009/0314337 A1 * | 12/2009 | Lee | H01L 31/075 | 136/255 |
| 2010/0045173 A1 * | 2/2010 | Kwon | H01L 27/3246 | 313/504 |
| 2010/0159633 A1 * | 6/2010 | Lee | H01L 21/324 | 438/88 |
| 2010/0193006 A1 * | 8/2010 | Kang | H01L 31/1804 | 136/244 |
| 2010/0208324 A1 * | 8/2010 | Huang | G02F 1/1521 | 359/267 |
| 2011/0011453 A1 * | 1/2011 | Kang | H01L 31/046 | 136/256 |
| 2011/0198322 A1 * | 8/2011 | Manens | B23K 26/032 | 219/121.72 |
| 2011/0284056 A1 * | 11/2011 | Lee | H01L 31/076 | 136/249 |
| 2012/0000506 A1 * | 1/2012 | Nam | H01L 31/0463 | 136/244 |
| 2012/0104284 A1 * | 5/2012 | Verschuren | B23K 26/0676 | 250/492.1 |
| 2012/0135545 A1 * | 5/2012 | Kang | H01L 31/0463 | 438/4 |
| 2012/0273034 A1 * | 11/2012 | Sato | H01L 31/0392 | 136/252 |
| 2013/0133714 A1 * | 5/2013 | Berens | H01L 31/05 | 136/244 |
| 2013/0181143 A1 * | 7/2013 | Betzig | G02B 21/0032 | 250/459.1 |
| 2013/0201545 A1 * | 8/2013 | Frey | G02F 1/1523 | 359/265 |
| 2014/0137931 A1 * | 5/2014 | Shin | H01L 31/02167 | 136/256 |
| 2014/0168624 A1 * | 6/2014 | Jeun | H01L 51/0013 | 355/69 |
| 2014/0193941 A1 * | 7/2014 | Kim | H01L 31/0463 | 438/72 |
| 2014/0236323 A1 * | 8/2014 | Brown | G02F 1/163 | 700/90 |
| 2014/0272326 A1 * | 9/2014 | Rickers | H01L 51/56 | 428/195.1 |
| 2014/0305492 A1 * | 10/2014 | Verger | H01L 31/022441 | 136/251 |
| 2014/0307240 A1 * | 10/2014 | Jeun | H01L 51/0013 | 355/55 |
| 2014/0338728 A1 * | 11/2014 | Cheyns | H01L 51/0015 | 136/249 |
| 2014/0352752 A1 * | 12/2014 | Kim | H01L 31/022425 | 136/244 |
| 2014/0356987 A1 * | 12/2014 | Lee | B23K 26/02 | 438/15 |
| 2015/0008415 A1 * | 1/2015 | Schwab | H01L 51/0023 | 257/40 |
| 2015/0017816 A1 * | 1/2015 | Oh | H01L 21/268 | 438/795 |
| 2015/0034614 A1 * | 2/2015 | Kim | H01L 22/20 | 219/121.65 |
| 2015/0162244 A1 * | 6/2015 | Holden | H01L 21/3043 | 438/9 |
| 2015/0214409 A1 * | 7/2015 | Pfeiffer | H01L 31/0463 | 136/249 |
| 2015/0243934 A1 * | 8/2015 | Han | H01L 51/56 | 438/34 |
| 2016/0190456 A1 * | 6/2016 | You | H01L 51/0018 | 257/40 |

FOREIGN PATENT DOCUMENTS

| | | | |
|---|---|---|---|
| KR | 10-2005-0059644 A | 6/2005 | |
| KR | 10-2009-0045342 A | 5/2009 | |
| KR | 10-2013-0048007 A | 5/2013 | |

OTHER PUBLICATIONS

Lee, K. "Effect of Laser Beam Trajectory on Donor Plate in Laser Induced Thermal Printing Process" Jour. of Opt. Soc. of Korea vol. 15, No. 4 Dec. 2011 pp. 362-367.*

Petsch, T. "Laser micromachining of organic LEDs" Proc. of SPIE vol. 8244 Feb. 9, 2012 pp. 824409-1 through 824409-6.*

* cited by examiner

LASER BEAM IRRADIATION APPARATUS AND MANUFACTURING METHOD OF
ORGANIC LIGHT EMITTING DISPLAY
APPARATUS USING THE SAME

CROSS-REFERENCE TO RELATED APPLICATION

Korean Patent Application No. 10-2014-0023712, filed on Feb. 27, 2014, in the Korean Intellectual Property Office, and entitled: "Laser Beam Irradiation Apparatus and Manufacturing Method of Organic Light Emitting Display Apparatus Using the Same," is incorporated by reference herein in its entirety.

BACKGROUND

1. Field

One or more embodiments relate to a laser beam irradiation apparatus and a manufacturing method of organic light-emitting display apparatus using the same.

2. Description of the Related Art

Display devices may include portable flat panel display devices. For example, flat panel display devices may include electroluminescence display devices with wide viewing angles, high contrast, and fast response speed. These advantages of the electroluminescence display devices attract public attention as next-generation display devices.

For example, electroluminescence display devices may include organic light-emitting display devices, which include emission layers with organic materials. These emission layers exhibit enhanced brightness, higher driving voltage, and faster response speed than inorganic light-emitting display devices, and are capable of displaying multi-color.

A conventional organic light-emitting display device may have one or more organic layers, including an emission layer, interposed between an anode and a cathode. As a thickness of a cathode decreases, resistance of the cathode increases and occurrence of an IR drop also increases, causing reduced brightness. Thus, a method of decreasing an IR drop by decreasing cathode resistance by connecting an auxiliary electrode with a cathode is used.

SUMMARY

One or more embodiments include a laser beam irradiation apparatus and a manufacturing method of organic light-emitting display apparatus using the same.

According to one or more embodiments, a laser beam irradiation apparatus includes a laser light source, a controller for controlling energy of light generated by the laser light source, a first optical system for adjusting a shape of light that has passed through the controller, a scanner for adjusting the direction of light that has passed through the first optical system, and an F-theta lens for diminishing a beam that has passed through the scanner.

The controller may include an acusto optic modulator (AOM).

The first optical system may include a first slit for transmitting a portion of light that has passed through the controller and a reducer for reducing the size of a cross section of light that has passed through the first slit.

The first optical system may include a second slit for transmitting a portion of light that has passed through the controller and a homogenizer for converting light that has passed through the second slit into a flat-top beam.

The first optical system may include a third slit for transmitting a portion of light that has passed through the controller and a zoom beam expander for adjusting the size of a cross section of light that has passed through the third slit.

The first optical system, the scanner, and the F-theta lens may constitute a first set, and a plurality of the first sets may be arranged, a beam split optical system may be arranged between the controller and the first set, and each light split by the beam split optical system may be incident to each of the first sets.

The beam split optical system may include one or more semitransparent mirrors.

According to another embodiment, a method of manufacturing an organic light-emitting display apparatus may include forming an auxiliary electrode, forming an intermediate layer on the auxiliary electrode, forming a contact hole on the intermediate layer by irradiating a laser beam by using a laser beam irradiation apparatus that includes a laser light source, a controller for controlling energy of light generated by the laser light source, a first optical system for adjusting a shape of light that has passed the controller, a scanner that adjusts the direction of light that has passed through the first optical system, and an F-theta lens for reducing a beam that has passed through the scanner, and contacting the auxiliary electrode and the cathode through the contact hole by forming the cathode on the intermediate layer.

The particles generated in the process of irradiating the laser beam may be released in the form of gas.

The size of the particles may be smaller than 20 nm.

The controller may include an acusto optic modulator (AOM).

The first optical system, the scanner, and the F-theta lens may constitute a first set, and a plurality of the first sets many be arranged, a beam split optical system may be arranged between the controller and the first set, and each light split by the beam split optical system may be incident to each of the first sets.

The cathode may include lithium (Li), calcium (Ca), lithium fluoride (LiF)/calcium (Ca), lithium fluoride (LiF)/aluminum (Al), aluminum (Al), silver (Ag), magnesium (Mg), ytterbium (Yb), or a compound of these.

The thickness of the cathode may be no less than 1 Å and no more than 200 Å.

The forming the contact hole may be conducted in a vacuum

According to another embodiment, a method of manufacturing an organic light-emitting display apparatus includes forming an auxiliary electrode, forming an intermediate layer on the auxiliary electrode, irradiating a laser beam toward the intermediate layer to form a contact hole through the intermediate layer, and forming a cathode electrode on the intermediate layer and in the contact hole, such that the cathode electrode contacts the auxiliary electrode through the contact hole, wherein irradiating the laser beam is performed in vacuum and includes irradiating a laser light source toward the intermediate layer, controlling energy of light generated by the laser light source, adjusting a shape and a direction of light generated by the laser light source, and diminishing the adjusted light beam.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that although the terms "first," "second," etc., may be used herein to describe various components, these components should not be limited by these terms. These components are only used to distinguish one component from another.

Singular expressions, unless defined otherwise in context, include plural expressions. As used herein, the term "and/or" includes any and all combinations of one or more of the associated listed items. Further, in the embodiments below, it will be further understood that the terms "comprise" and/or "have" used herein specify the presence of stated features or components, but do not preclude the presence or addition of one or more other features or components.

In the drawing figures, the dimensions of layers and regions may be exaggerated for clarity of illustration. It will also be understood that when an element, e.g., a layer, a region, or a component, is referred to as being "above" or "on" another element, it can be directly above or on the other element, or intervening elements may also be present. In addition, it will also be understood that when an element is referred to as being "between" two elements, it can be the only element between the two elements, or one or more intervening elements may also be present. Like reference numerals refer to like elements throughout.

Figure 1:
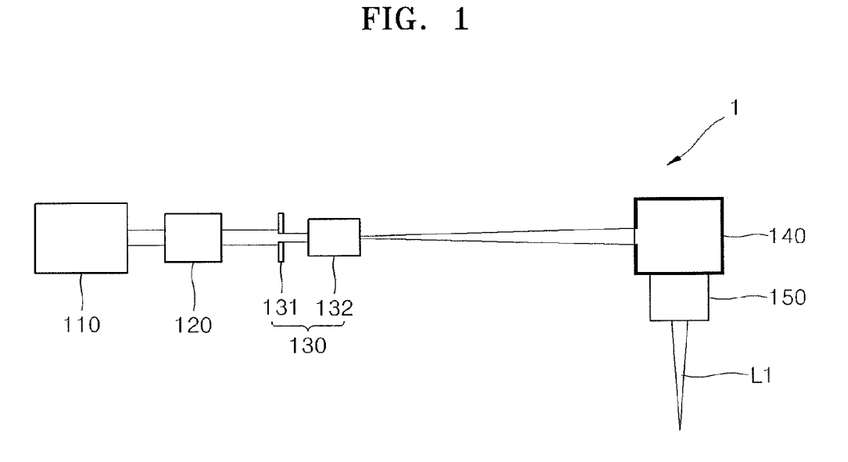
FIG. 1 illustrates a schematic diagram of a laser beam irradiation apparatus according to an embodiment.

FIG. 1 is a diagram schematically illustrating a laser beam irradiation apparatus 1 according to an embodiment.

Referring to FIG. 1, the laser beam irradiation apparatus 1 according to an embodiment may include a laser light source 110, a controller 120, a first optical system 130, a scanner 140, and an F-theta lens 150. Laser light may be generated in the laser light source 110, e.g., a laser oscillator.

The controller 120 controls energy of light generated by the laser light source 110. For example, the controller 120 may include an acusto-optic modulator (AOM). In case of laser processing, precise conversion, high-speed control, and real-time control of the laser energy may be achieved with applied voltage of the AOM.

The first optical system 130 may adjust a cross-section, e.g., shape, of light emitted from the controller 120 toward the scanner 140. The first optical system 130 may include a first slit 131 and a reducer 132. The first slit 131 transmits a portion of light emitted from the controller 120, e.g., the first slit 131 transmits only a predetermined portion of a center of a Gaussian beam whose energy has been controlled by the controller 120 to have a flat-like beam. The reducer 132 reduces a size of a cross section of light that has passed through the first slit 131.

The scanner 140 adjusts a direction of light emitted from the first optical system 130. For example, the scanner 140 may be a galvano-scanner that includes two reflection mirrors. The scanner 140 may determine a processing point in a processing portion (not shown) by controlling the x and y directions of an incident beam.

The F-theta lens 150 diminishes a beam emitted from the scanner 140, e.g., the F-theta lens 150 substantially reduces a size of a laser spot incident on a desired processing surface. In detail, a laser beam L1 that has passed through the F-theta lens 150 is delivered to a processing portion. Even though an incidence angle of light emitted from the laser source 110 toward the F-theta lens 150 is changed, e.g., adjusted by about 90 degrees, by the scanner 140, a field curvature caused by aberration may be compensated by the F-theta lens 150. For example, a disparity in beam quality in a whole scanned area having a wide scan field may disappear or may be substantially reduced by the F-theta lens 150, so the laser beam emitted from the F-theta lens 150 and is incident on a desired processing surface exhibits a reduced beam size with high energy uniformity.

Therefore, when laser drilling proceeds with the laser beam irradiation apparatus 1, the laser beam L1 emitted from the F-theta lens 150 is delivered to be incident, e.g., directly, on the processing portion, i.e., the desired processing surface. As such, the laser beam L1 may be delivered to, e.g., an organic layer, and form a contact hole therein while generating particles having a reduced size.

Figure 2:
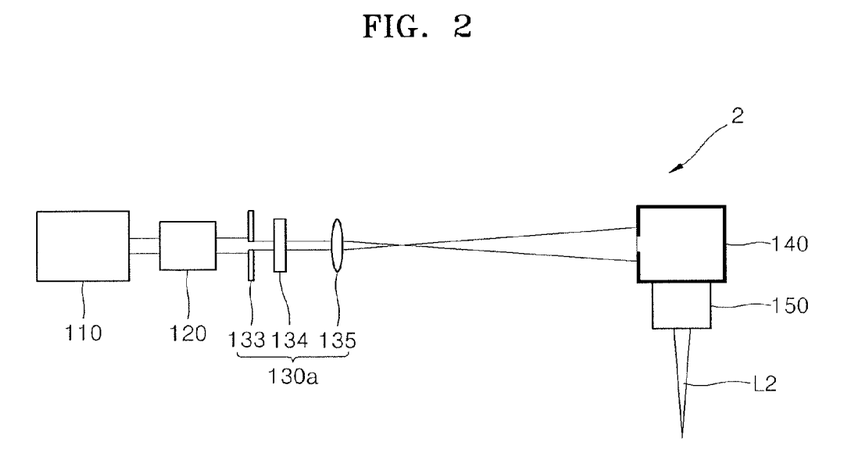
FIG. 2 illustrates a schematic diagram of a laser beam irradiation apparatus according to another embodiment.

FIG. 2 is a diagram schematically illustrating a laser beam irradiation apparatus 2 according to another embodiment.

Referring to FIG. 2, the laser beam irradiation apparatus 2 according to an embodiment may include the laser light source 110, the controller 120, a first optical system 130a, the scanner 140, and the F-theta lens 150. Laser light may be generated in the laser light source 110.

The controller 120 controls energy of light generated by the laser light source 110. The controller 120 may include the AOM. In the case of laser processing, precise conversion, high-speed control, and real-time control of the laser energy may be achieved with applied voltage of the AOM.

The first optical system 130a may adjust a shape of light that has passed through the controller 120. The first optical system 130a may include a second slit 133, a homogenizer 134, and a convex lens 135. The second slit 133 transmits a portion of light that has passed through the controller 120. Light that has passed through the second slit 33 may be converted into a flat top beam by the homogenizer 134 and the convex lens 135. The process quality may be enhanced by forming a flat top beam by the first optical system 130a, and by balancing laser energy in a processing area, e.g., during a laser drilling process.

The scanner 140 adjusts the direction of light that has passed through the first optical system 130a. The scanner 140 may be a galvano-scanner that includes two reflection mirrors. The scanner 140 may determine a processing point in a processing portion (not shown) by controlling the x and y directions of an incident beam.

The F-theta lens 150 diminishes a beam that has passed through the scanner 140. The beam that has passed through the F-theta lens 150 is delivered to the processing portion. As the F-theta lens 150 is arranged, even though an incidence angle toward the F-theta lens 150 is changed by the scanner 140, curvature of field caused by aberration may be compensated. The disparity in beam quality in a whole scanned area having a wide scan field may disappear by the F-theta lens 150.

Laser drilling may proceed when a laser beam L2 that has passed through the F-theta lens 150 is delivered to the processing portion. The laser beam L2 may be delivered to an organic layer and form a contact hole therein.

Figure 3:
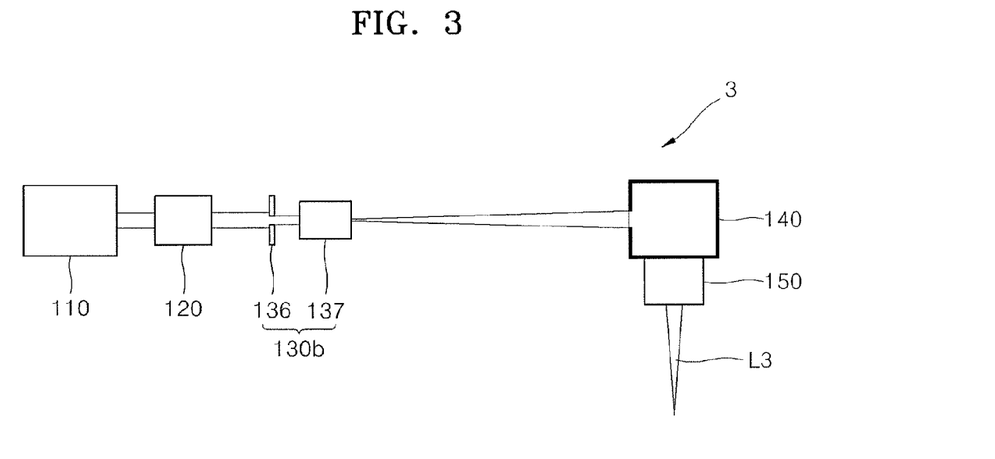
FIG. 3 illustrates a schematic diagram of a laser beam irradiation apparatus according to another embodiment.

FIG. 3 is a diagram schematically illustrating a laser beam irradiation apparatus 3 according to another embodiment.

Referring to FIG. 3, the laser beam irradiation apparatus 3 according to another embodiment may include the laser light source 110, the controller 120, a first optical system 130b, the scanner 140, and the F-theta lens 150. Laser light may be generated in the laser light source 110.

The controller 120 controls energy of light generated by the laser light source 110. The controller 120 may include the AOM. In the case of laser processing, precise conversion, high-speed control, and real-time control of the laser energy may be achieved with applied voltage of the AOM.

The first optical system 130b may adjust a shape of light that has passed through the controller 120. The first optical system 130b may include a third slit 136 and a zoom beam expander 137. The third slit 136 transmits a portion of light that has passed through the controller 120. The zoom beam expander 137 adjusts the size of a cross section of light emitted from the third slit 136. That is, the size of a laser beam delivered to a processing portion (not shown) may be adjusted by the zoom beam expander 137. The adjustment range of the size of the laser beam may vary in accordance with a magnification of the zoom beam expander 137. For example, in the case of a laser drilling process, flexibility in terms of the size of the laser beam, i.e., laser beam L3 emitted from the F-theta lens 150, may be obtained.

The scanner 140 adjusts the direction of light that has passed through the first optical system 130b. The scanner 140 may be a galvano-scanner that includes two reflection mirrors. The scanner 140 may determine a processing point in the processing portion by controlling the x and y directions of an incident beam.

The F-theta lens 150 diminishes a beam that has passed through the scanner 140. The beam that has passed through the F-theta lens 150 is delivered to the processing portion. As the F-theta lens 150 is arranged, even though an incidence angle toward the F-theta lens 150 is changed by the scanner 140, curvature of field caused by aberration may be compensated. The disparity in beam quality in a whole scanned area having a wide scan field may disappear by the F-theta lens 150.

Laser drilling may proceed when the laser beam L3 emitted from the F-theta lens 150 is delivered to the processing portion. The laser beam L3 may be delivered to an organic layer and form a contact hole therein.

Figure 4:
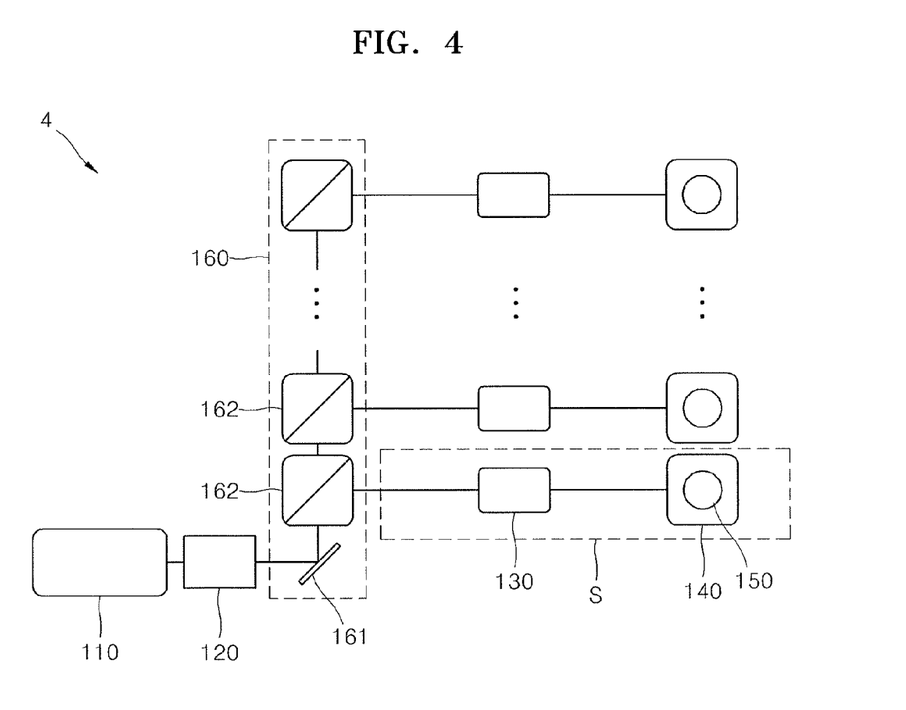
FIG. 4 illustrates a schematic diagram of a laser beam irradiation apparatus according to another embodiment.

FIG. 4 is a diagram schematically illustrating a laser beam irradiation apparatus 4 according to another embodiment.

Referring to FIG. 4, the laser beam irradiation apparatus 4 according to another embodiment may include the laser light source 110, the controller 120, a first optical system 130, the scanner 140, the F-theta lens 150, and a beam split optical system 160. Laser light may be generated in the laser light source 110.

The controller 120 controls energy of light generated by the laser light source 110. The controller 120 may include the AOM. In the case of laser processing, precise conversion, high-speed control, and real-time control of the laser energy may be achieved with applied voltage of the AOM.

The first optical system 130, the scanner 140, and the F-theta lens 150 may constitute a first set S. A plurality of first sets S may be arranged. It is noted that while FIG. 4 illustrates the first optical system 130 of FIG. 1, any one of the first optical systems 130, 130a, and 130b of FIGS. 1-3 may be used in the first set S.

The beam split optical system 160 may be interposed between the controller 120 and the first sets S. Light emitted from the controller 120 may be split by the beam split optical system 160 into a plurality of output beams. Each output beam emitted from the beam split optical system 160 may be transmitted to a respective first set S. The beam split optical system 160 may include a reflection mirror 161 and one or more semitransparent mirrors 162. Each output beam emitted from the beam split optical system 160 may be transmitted to a corresponding first set S by a corresponding semitransparent mirror 162 after being reflected by the reflection mirror 161. One semitransparent mirror 162 may be arranged to correspond to one first set S.

Laser drilling may proceed when a laser output beam that has passed through the first set S is delivered to a processing portion (not shown). The laser output beam may be delivered to an organic layer and form a contact hole therein. Since a single laser input beam is split into a plurality of laser output beams respectively implemented in laser processing, productivity may be enhanced and process time may be reduced.

Figure 5:
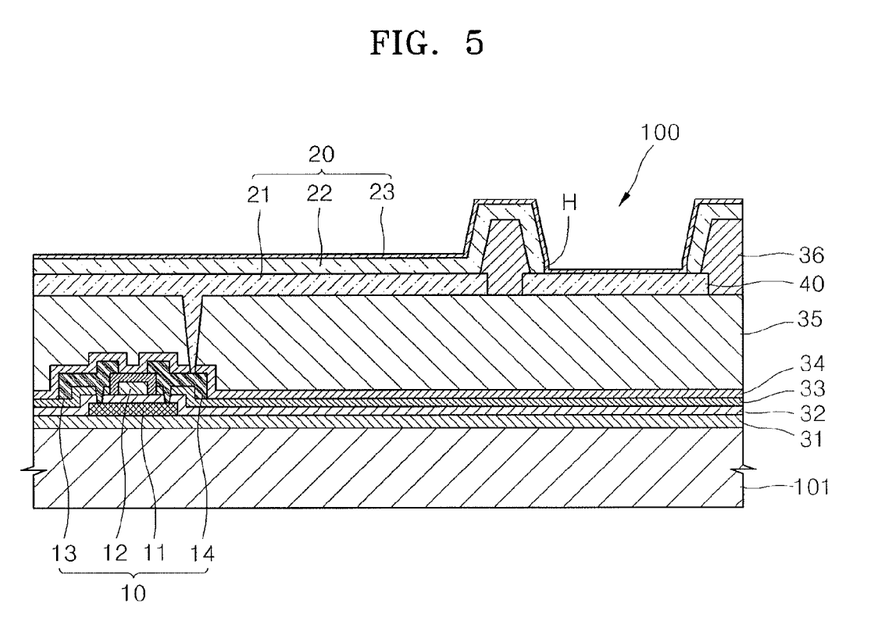
FIG. 5 illustrates a partial cross-sectional view of an organic light-emitting display apparatus with an auxiliary electrode according to an embodiment.

FIG. 5 is a cross-sectional view of an organic light-emitting display apparatus 100 with an auxiliary electrode 40 according to embodiments.

Referring to FIG. 5, the organic light-emitting display apparatus 100 may include a cathode 23 and the auxiliary electrode 40. An organic light-emitting device 20 and a thin film transistor (TFT) 10 connected to the organic light-emitting device 20 are provided on a substrate 101. In FIG. 5, one organic light-emitting device 20 and one TFT 10 are illustrated, but embodiments are not limited thereto, e.g., the organic light-emitting display apparatus may include a plurality of the organic light-emitting devices 20 and a plurality of the TFTs 10.

The organic light-emitting display apparatus 100 may be classified into a passive matrix (PM) or an active matrix (AM) according to whether a driving of the organic light-emitting device 20 is controlled by the TFT or not. That is, the organic light-emitting display apparatus 100 may be an AM type or a PM type. Hereinafter, n organic light-emitting display apparatus of an AM type will be described as an example.

A buffer layer 31, e.g., formed of silicon dioxide ($SiO_2$) and/or silicon nitride ($SiN_x$), may be included on the substrate 101. The buffer layer 31 may planarize the substrate 101 and prevent impure elements from penetrating from the substrate 101.

An active layer 11 of the TFT 10 may be formed on the buffer layer 31 as a semiconductor material. The active layer 11 may be formed to contain various materials. For example, the active layer 11 may include an inorganic semiconductor material, e.g., amorphous silicon or crystalline silicon. In another example, the active layer 11 may include an oxide semiconductor. In yet another example, the active layer 11 may include an organic semiconductor material.

A gate insulating layer 32 may be formed to cover the active layer 11. A gate electrode 12 may be provided on the gate insulating layer 32, and an interlayer insulating layer 33 may be formed to cover the gate electrode 12. A source electrode 13 and a drain electrode 14 may be provided on the interlayer insulating layer 33, and a passivation layer 34 and a planarization layer 35 may be sequentially provided to cover the source electrode 13 and the drain electrode 14.

The gate insulating layer 32, the interlayer insulating layer 33, the passivation layer 34, and the planarization layer 35 may be provided as insulators, and may be formed as inorganic materials, organic materials, or organic or inorganic compounds, with a structure of one layer or a plurality of layers. The layered structure of the TFT 10 in FIG. 5 is an example, and thus various other structures may be applied to the TFT 10.

An anode 21 of the organic light-emitting device 20 may be formed on top of the planarization layer 35, and a pixel defining layer 36 may be formed to cover the anode 21. After an opening, which exposes some of the anode 21, is formed in the pixel defining layer 36, an intermediate layer 22 of the organic light-emitting device may be formed within a predetermined area through the opening. A cathode 23 of the organic light-emitting device 20 may be formed to cover all pixels. Polarities of the anode 21 and cathode 23 may be switched.

The anode 21 may be provided as a transparent electrode or a reflective electrode. When the anode 21 is provided as a transparent electrode, the anode 21 may be formed of, e.g., indium tin oxide (ITO), indium zinc oxide (IZO), zinc oxide (ZnO), or indium oxide ($In_2O_3$). When the anode 21 is provided as a reflective electrode, the anode 21 may include a reflecting film that is formed of, e.g., silver (Ag), magnesium (Mg), aluminum (Al), platinum (Pt), palladium (Pd), gold (Au), nickel (Ni), neodymium (Nd), iridium (Ir), chromium (Cr), or a compound of thereof, and may also include a film that is formed over the reflective film by using, e.g., indium tin oxide (ITO), indium zinc oxide (IZO), zinc oxide (ZnO), or indium oxide ($In_2O_3$).

The cathode 23 may be formed as a transparent electrode or a reflective electrode. When the cathode 23 is provided as a transparent electrode, the cathode 23 may be formed as a film of, e.g., lithium (Li), calcium (Ca), lithium fluoride (LiF)/calcium (Ca), lithium fluoride (LiF)/aluminum (Al), aluminum (Al), silver (Ag), magnesium (Mg), ytterbium (Yb), or a compound of thereof, deposited on the intermediate layer 22. When the cathode 23 is provided as a reflective electrode, the cathode 23 may be formed by depositing, e.g., lithium (Li), calcium (Ca), lithium fluoride (LiF)/calcium (Ca), lithium fluoride (LiF)/aluminum (Al), aluminum (Al), magnesium (Mg), or a compound of thereof to a predetermined thickness.

When the organic light-emitting display apparatus 100 is a top-emission type, the cathode 23 may be provided as a transparent electrode, and the thickness of the cathode 23 may be very thin. For example, the thickness of the cathode 23 may be about 1 angstrom to about 200 angstroms. As the cathode 23 is thinly formed, the resistance of the cathode 23 and the occurrence of an IR drop may increase. Accordingly, the resistance of the cathode 23 may be decreased by the auxiliary electrode 40.

The auxiliary electrode 40 may be formed on the planarization layer 35. The auxiliary electrode 40 may be formed of the same materials and by the same process as those of the anode 21. The auxiliary electrode 40 may contact, e.g., directly contact, the cathode 23. The auxiliary electrode 40 may contact the cathode 23 through a contact hole H formed through the intermediate layer 22.

The intermediate layer 22, which is provided between the anode 21 and the cathode 23, may be formed by using a low-molecular-weight organic material or a polymer organic material. When a low-molecular-weight organic matter is used, a hole injection layer (HIL) (not shown), a hole transport layer (HTL) (not shown), an electron transport layer (ETL) (not shown), an electron injection layer (EIL) (not shown), and others may be formed in layers, in a single or complex structure, with the intermediate layer interposed therein. The polymer organic material may have a structure in which the HTL (not shown) is further included between the intermediate layer 22 and the anode 21.

The intermediate layer 22 may include the contact hole H for providing contact between the cathode 23 and the auxiliary electrode 40. In the present embodiment as described above, the intermediate layer 22 is formed within an opening to have a light-emitting material corresponding to each pixel, but embodiments are not limited thereto, e.g., the intermediate layer 22 may be generally included to correspond to the entire pixel defining layer 36 regardless of the position of a pixel. The intermediate layer 22 may be formed, e.g., by vertically layering or mixing layers which include light-emitting materials emitting red, green, or blue. If white light is emitted, other colors may be combined. In addition, if white light is emitted, a color changing layer or a color filter may be further provided.

The organic light-emitting device 20 described above may be deteriorated by materials such as water or oxygen. Therefore, an encapsulation layer (not shown) may be arranged to cover the organic light-emitting device 20.

FIGS. 6A through 6D illustrate a manufacturing method of the organic light-emitting display apparatus 20 according to an embodiment.

Figure 6A:
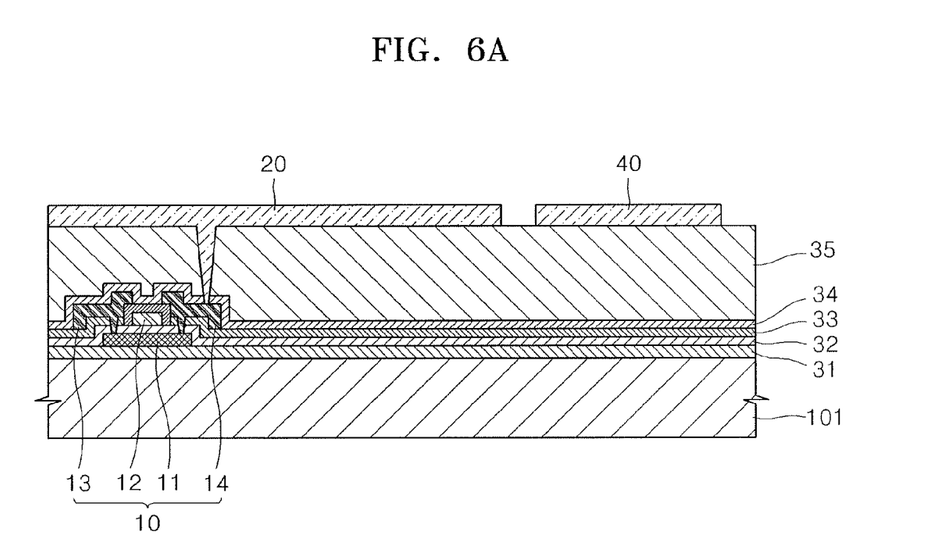
FIGS. 6A through 6D illustrate stages in a method of manufacturing an organic light-emitting display apparatus according to an embodiment.

As illustrated in FIG. 6A, the auxiliary electrode 40 is formed. The auxiliary electrode 40 may be formed on the planarization layer 35. The auxiliary electrode 40 may be formed of the same materials as those of the anode 21. The auxiliary electrode 40 may be formed by the same process as that of the anode 21.

Figure 6B:
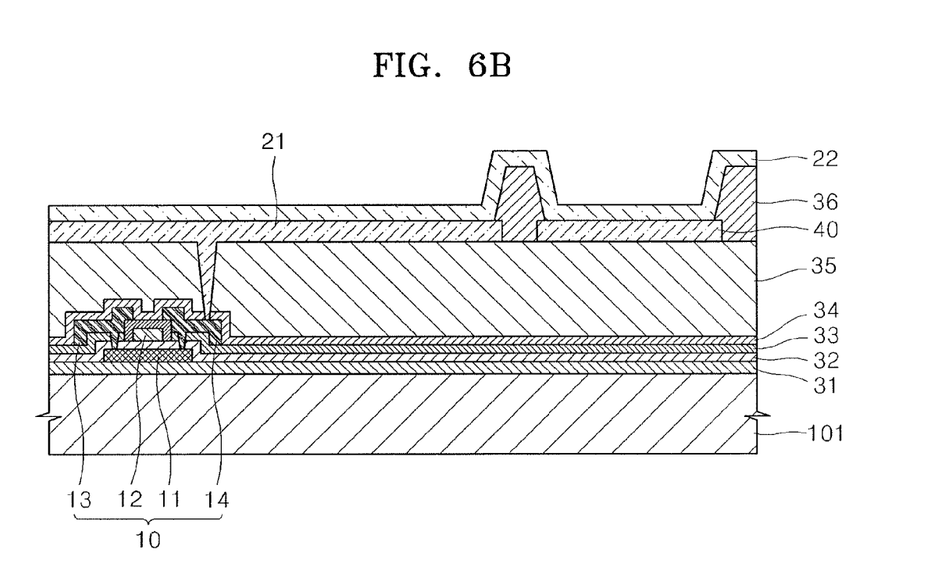

Then, as illustrated in FIG. 6B, the intermediate layer 22 is formed on the auxiliary electrode 40. After the pixel defining layer 36, which covers an edge of the auxiliary electrode 40, has been formed on the auxiliary electrode 40, the intermediate layer 22 may be formed on the pixel defining layer 36.

Figure 6C:
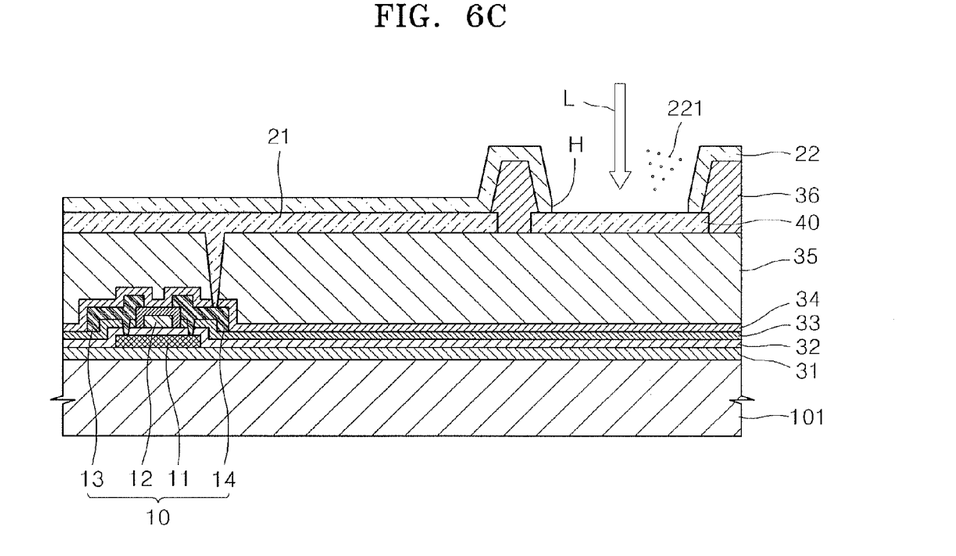

As illustrated in FIG. 6C, the contact hole H is formed on the intermediate layer 22. The contact hole H may be formed by irradiating a laser beam L. The laser beam L may be emitted by using the laser beam irradiation apparatus described previously with reference to any one of FIGS. 1-4, so the laser beam L may be either one of laser beams L1 through L3.

Particles 221, which are generated in the process of irradiating the laser beam L, may be released in the form of gas during formation of the contact hole H. Accordingly, contamination around the contact hole H, caused by the particles 221, may be prevented, and the process of forming the auxiliary electrode 40 which contacts the cathodes 23 may be simplified.

In detail, a size of each of the particles generated during the process of irradiating the laser beam L may be small enough to be released in the form of gas. For example, a size of each of the particles 221 generated in the process of irradiating the laser beam L may be smaller than about 20 nm. Therefore, since the process of forming the contact hole H by irradiating the laser beam L on the intermediate layer 22 is conducted in a vacuum, the particles 221, which are generated in the process of irradiating the laser beam L, may be released in the form of gas. Thus, the contact hole H may be formed in a vacuum with minimized contamination of elements.

Figure 6D:
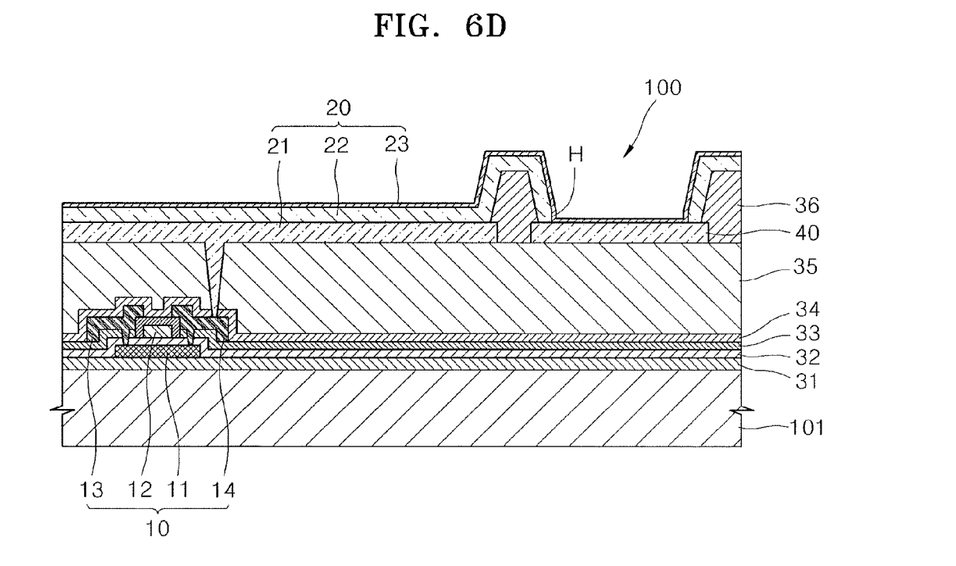

As illustrated in FIG. 6D, the cathode 23 may be formed on the intermediate layer 22. The cathode 23 may contact the auxiliary electrode 40 through the contact hole H. The cathode 23 may include, e.g., lithium (Li), calcium (Ca), lithium fluoride (LiF)/calcium (Ca), lithium fluoride (LiF)/aluminum (Al), aluminum (Al), silver (Ag), magnesium (Mg), ytterbium (Yb), or a compound of thereof. The thickness of the cathode 23 may be about 1 angstrom to about 200 angstroms.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an organic light-emitting display apparatus, the method comprising:
    forming an auxiliary electrode;
    forming a pixel defining layer having an opening which exposes some of the auxiliary electrode;
    forming an intermediate layer on the auxiliary electrode;
    irradiating a laser beam toward the intermediate layer by using a laser beam irradiation apparatus, such that a contact hole is formed through the intermediate layer; and
    forming a cathode electrode on the intermediate layer and in the contact hole, such that the cathode electrode contacts the auxiliary electrode through the contact hole,
    wherein the laser beam irradiation apparatus includes a laser light source, a controller for controlling energy of light generated by the laser light source, a first optical system for adjusting a shape of light emitted from the controller, a scanner that adjusts a direction of light emitted from the first optical system, and an F-theta lens for reducing a beam emitted from the scanner.

2. The method as claimed in claim 1, wherein irradiating the laser beam toward the intermediate layer includes generating particles in the form of gas.

3. The method as claimed in claim 2, wherein irradiating the laser beam toward the intermediate layer includes generating particles having a size smaller than about 20 nm.

4. The method as claimed in claim 1, wherein irradiating the laser beam toward the intermediate layer includes using an acusto-optic modulator (AOM).

5. The method as claimed in claim 1, wherein irradiating the laser beam toward the intermediate layer includes splitting a single input beam of laser light source into a plurality of output beams, each output beam being incident on a different region of the intermediate layer to form separate contact holes.

6. The method as claimed in claim 1, wherein the cathode electrode is formed of lithium (Li), calcium (Ca), lithium fluoride (LiF)/calcium (Ca), lithium fluoride (LiF)/aluminum (Al), aluminum (Al), silver (Ag), magnesium (Mg), ytterbium (Yb), or a compound thereof.

7. The method as claimed in claim 1, wherein the cathode is formed to have a thickness of about 1 angstrom to about 200 angstroms.

8. The method as claimed in claim 1, wherein irradiating the laser beam is performed in vacuum.

9. A method of manufacturing an organic light-emitting display apparatus, the method comprising:
    forming an auxiliary electrode;
    forming a pixel defining layer having an opening which exposes some of the auxiliary electrode;
    forming an intermediate layer on the auxiliary electrode;
    irradiating a laser beam toward the intermediate layer to form a contact hole through the intermediate layer; and
    forming a cathode electrode on the intermediate layer and in the contact hole, such that the cathode electrode contacts the auxiliary electrode through the contact hole,
    wherein irradiating the laser beam is performed in vacuum and includes:
        irradiating a laser light source toward the intermediate layer,
        controlling energy of light generated by the laser light source,
        adjusting a shape and a direction of light generated by the laser light source, and
        diminishing the adjusted light beam.

10. A method of manufacturing an organic light-emitting display apparatus, the method comprising:
    forming an auxiliary electrode;
    forming a pixel defining layer having an opening which exposes some of the auxiliary electrode;
    forming an intermediate layer on the auxiliary electrode;
    irradiating a laser beam toward the intermediate layer to form a contact hole through the intermediate layer; and
    forming a cathode electrode on the intermediate layer and in the contact hole, such that the cathode electrode contacts the auxiliary electrode through the contact hole.

* * * * *